(12) United States Patent
Barash

(10) Patent No.: US 7,360,142 B1
(45) Date of Patent: Apr. 15, 2008

(54) METHODS, ARCHITECTURES, CIRCUITS, SOFTWARE AND SYSTEMS FOR CRC DETERMINATION

(75) Inventor: Dror Barash, Rannana (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 534 days.

(21) Appl. No.: 10/794,496

(22) Filed: Mar. 3, 2004

(51) Int. Cl.
*H03M 13/00* (2006.01)

(52) U.S. Cl. ..................................... 714/758
(58) Field of Classification Search ..................... None
See application file for complete search history.

(56) References Cited

U.S. PATENT DOCUMENTS

| | | | |
|---|---|---|---|
| 4,596,981 A | | 6/1986 | Ueno et al. |
| 4,944,038 A | | 7/1990 | Hardy et al. |
| 5,050,165 A | | 9/1991 | Yoshioka et al. |
| 5,138,316 A | * | 8/1992 | Konishi ........................ 341/67 |
| 5,164,943 A | | 11/1992 | Waggoner |
| 5,550,542 A | * | 8/1996 | Inoue ........................... 341/67 |
| 5,610,921 A | | 3/1997 | Christensen |
| 5,619,516 A | * | 4/1997 | Li et al. ...................... 714/807 |
| 5,638,370 A | | 6/1997 | Seconi et al. |
| 5,761,465 A | | 6/1998 | Nimishakvi et al. |
| 5,778,013 A | | 7/1998 | Jedwab |
| 5,901,250 A | * | 5/1999 | Ohara ......................... 382/246 |
| 5,935,269 A | | 8/1999 | Kodama et al. |
| 6,000,053 A | * | 12/1999 | Levine et al. ................ 714/766 |
| 6,009,547 A | * | 12/1999 | Jaquette et al. ............. 714/758 |
| 6,029,186 A | * | 2/2000 | DesJardins et al. .......... 708/492 |
| 6,061,820 A | | 5/2000 | Nakakita et al. |
| 6,172,626 B1 | * | 1/2001 | McDonnell et al. .......... 341/67 |
| 6,185,207 B1 | | 2/2001 | LaBerge et al. |
| 6,208,645 B1 | | 3/2001 | James et al. |
| 6,223,320 B1 | * | 4/2001 | Dubey et al. ................ 714/757 |
| 6,233,251 B1 | | 5/2001 | Kurobe et al. |
| 6,324,669 B1 | | 11/2001 | Westby |
| 6,357,032 B1 | | 3/2002 | Plotz et al. |

(Continued)

FOREIGN PATENT DOCUMENTS

WO    WO 00/65791 A1    11/2000

OTHER PUBLICATIONS

Dror Barash; "Methods, Architectures, Circuits, Software and Systems for Transmission Error Determination"; U.S. Appl. No. 10/690,780, filed Oct. 21, 2003.

(Continued)

*Primary Examiner*—Shelly Chase
*Assistant Examiner*—Sam Rizk

(57) ABSTRACT

Methods, circuits, architectures, and systems for error detection in transmitted data. The method generally includes the steps of (i) partitioning the unit of digital data into one or more full data lines and a remainder, wherein each of the full data lines comprises a predetermined number of data blocks, each of the data blocks has a first fixed length, the predetermined number is an integer of at least 2, and the remainder has a length less than the predetermined number times the first fixed length; (ii) if the remainder contains at least one data bit, adding to the remainder a padding vector having a length sufficient to generate a padded data line having the predetermined number of data blocks; and (iii) performing error checking calculations on the full data lines and the padded data line. The present invention reduces the chip area and power consumption, while improving system performance.

89 Claims, 9 Drawing Sheets

U.S. PATENT DOCUMENTS

| | | |
|---|---|---|
| 6,370,667 B1 | 4/2002 | Maki |
| 6,412,093 B1 | 6/2002 | Argentati et al. |
| 6,424,650 B1 | 7/2002 | Yang et al. |
| 6,560,742 B1 | 5/2003 | Dubey et al. |
| 6,570,884 B1 | 5/2003 | Connery et al. |
| 6,598,200 B1 | 7/2003 | Greenwood et al. |
| 6,738,946 B1 * | 5/2004 | Irvin .................... 714/776 |
| 6,754,870 B2 | 6/2004 | Yoshida et al. |
| 6,763,492 B1 | 7/2004 | Hurt et al. |
| 6,766,493 B1 | 7/2004 | Hoffman et al. |
| 6,795,946 B1 * | 9/2004 | Drummond-Murray et al. .................... 714/758 |
| 6,904,558 B2 | 6/2005 | Cavanna et al. |
| 6,931,581 B1 | 8/2005 | Cassiday et al. |
| 6,934,730 B2 * | 8/2005 | Direen et al. .................... 708/250 |
| 7,096,399 B2 | 8/2006 | Pieczul |
| 7,103,822 B2 | 9/2006 | Glaise et al. |
| 2001/0037481 A1 | 11/2001 | Suzuki et al. |
| 2002/0053059 A1 | 5/2002 | Hara et al. |
| 2002/0066059 A1 | 5/2002 | Hara et al. |

OTHER PUBLICATIONS

Dror Barash; "Methods, Circuits, Architectures, Software and Systems for Determining a Data Transmission Error and/or Checking or Confirming Such Error Determinations"; New U.S. Patent Application, filed Mar. 3, 2004.

* cited by examiner

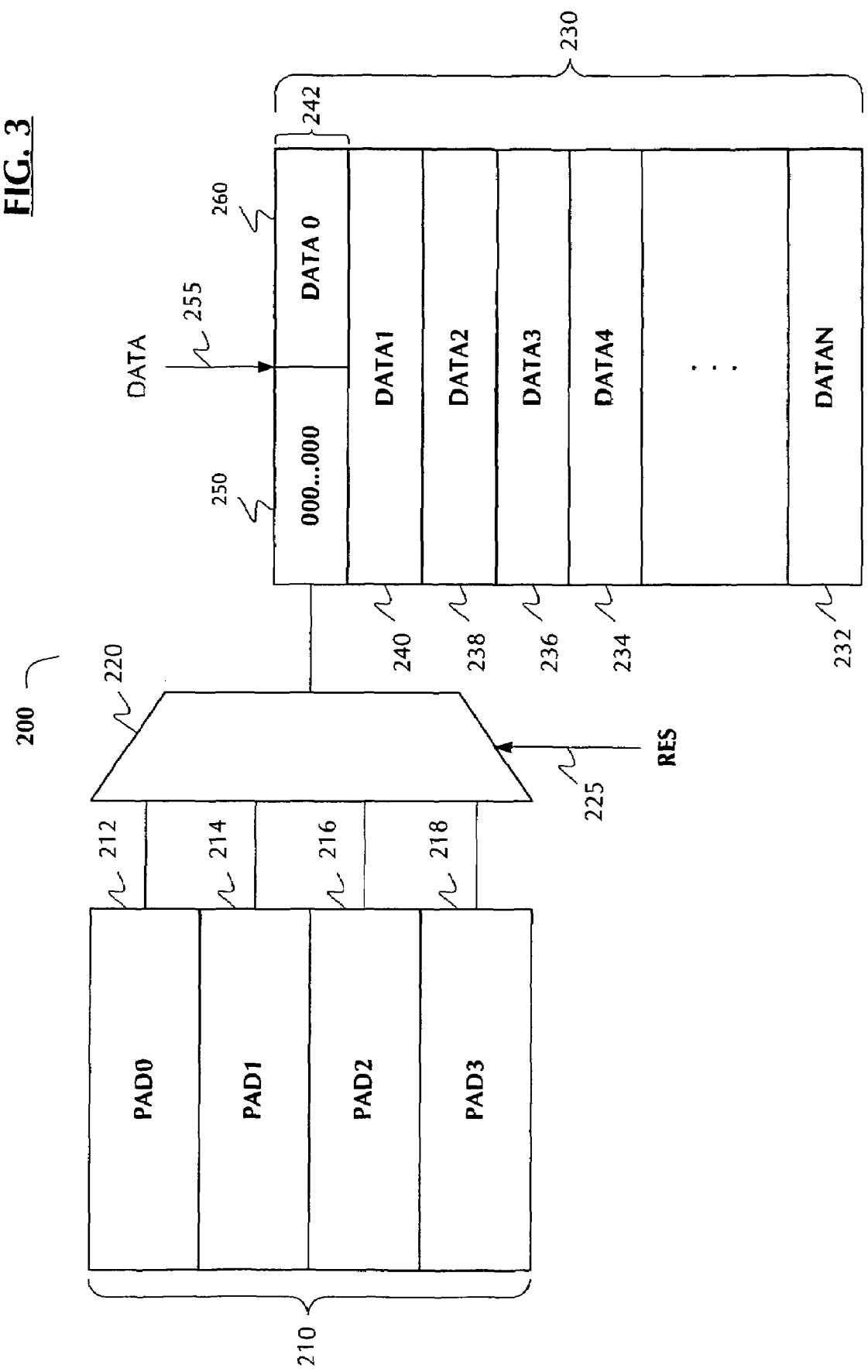

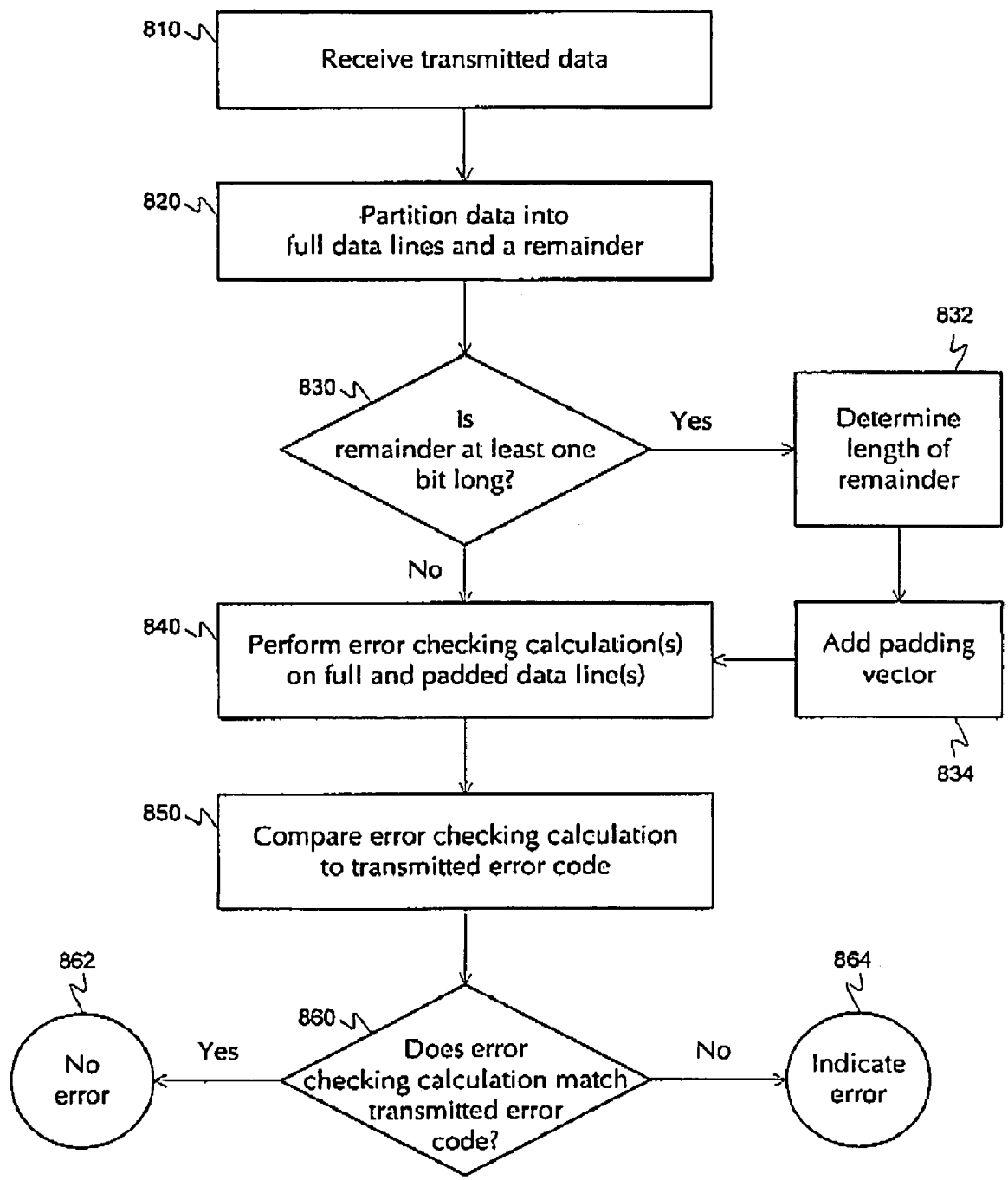

METHODS, ARCHITECTURES, CIRCUITS, SOFTWARE AND SYSTEMS FOR CRC DETERMINATION

RELATED APPLICATION(S)

The present application may be related to the co-pending, commonly-owned applications entitled "Methods, Architectures, Circuits, and Systems for Transmission Error Determination" (Ser. No. 10/690,780, filed on Oct. 21, 2003) and/or "Method(s), Architecture(s), Circuits, and Systems for Checking Error Determinations" (Ser. No. 10/795,003, filed on Mar. 3, 2004), the disclosures of which are incorporated herein by reference in their entireties.

FIELD OF THE INVENTION

The present invention generally relates to the field of data transmission error determinations. More specifically, embodiments of the present invention pertain to methods, architectures, circuits, software and systems for cyclic redundancy checking ("CRC") in a data storage or communications network.

DISCUSSION OF THE BACKGROUND

CRC is a well-known, conventional technique for finding data transmission errors. Typically, CRC is performed "on-the-fly" by hardware or logic circuitry, usually on serial data received in a device or system. Cyclic redundancy code (a result of a CRC determination) is typically generated at the data source, and is typically included in the header of a data packet or frame.

As shown in FIG. 1A, one type of data packet 10 comprises a plurality of words Data0 12 through DataN 20, where N is an integer of any length conforming to a conventional network data communications protocol. Each data word Data0-DataN contains 32 bits of data, consistent with the art-recognized meaning of "word" as it applies to data transmissions. To ensure that data packet 10 was transmitted successfully (i.e., without errors), a CRC calculation may be performed on the data therein. Data packet 10 may further comprise non-data information, such as a header and/or trailer of fixed or variable length, depending on the network and/or system. However, since headers and trailers are not data, they are not included in a CRC determination.

Since data packet 10 contains data words 12-20 each having the same length, a single CRC circuit block can perform the CRC calculation. FIG. 1B shows conventional receiver circuit blocks configured to process incoming data and perform a CRC calculation. For example, receiver block RX 52 receives serial data from a source device in a network. Such data is typically binary or digital data. Receiver block RX 52 is generally configured to recover a clock signal from the incoming serial data packet 10, and may be further configured to deserialize the packet (i.e., convert the serial data bits to parallel data bits). Header detection and removal block 54 receives the data packet 10 from receiver block 52 on serial or parallel bus 56, and detects and removes non-data information (such as a header) from the packet. The data words Data0 12 through DataN 20 are transmitted to CRC block 60 for the CRC calculation, and the non-data information is generally sent to another functional block (such as a decoder or data processor) for subsequent processing. Since CRC block 60 performs a CRC calculation one word at a time, CRC block 60 generally requires at least N clock cycles to calculate CRC on data words Data0 12 through DataN 20.

Conventionally, the wider the bus(ses) and the greater the number of parallel data bits that can be processed simultaneously, the faster such data can be processed. Thus, CRC circuits have been developed to calculate a CRC on more than one word of data at a time (see, e.g., U.S. Patent Application Publication Nos. 2002/0053059 and 2002/0066059). However, since the data packet 10 can include any number of data words and/or data bits that conform to a conventional network data communications protocol, the "multiple data word" approach often results in the last word in data packet 10 having a length less than the full multiple word length.

FIG. 2A shows an example of a "multiple word" data packet 100, comprising a plurality of multiple word length data lines Data0 102 through DataN−1 108 and remainder line DataN 110. In this example, each of multiple word length data lines Data0 102 through DataN−1 108 has a length of $2^m$ bits, where $m \geq 6$. In a typical approach, m=7, and as a result, each of data lines Data0 102 through DataN−1 108 also has a length of four (4) words. However, remainder line DataN 110 may have a length of from 1 data word to one word less than the full multiple word length. In the typical approach where m=7, remainder line DataN 110 may have a length of from 1 to 3 data words. (Note that, in the case where m=7, remainder line DataN 110 cannot have a length of zero or four data words, although data packet 100 can contain 4*N or 4*(N−1) data words. In such cases, there simply is no remainder.)

Previous approaches to calculating a CRC on multiple data words have resulted in architectures containing at least two sets of CRC hardware. One set of CRC hardware operated on the full length, multiple-word blocks or lines of data, and one or more other sets of CRC hardware operated on remainder data lines having a length less than the full, multiple-word length. In some cases, multiple CRC calculation circuit blocks were added to process remainders of variable lengths, in which the additional CRC calculation circuit blocks were configured to process data of different fixed lengths, and the appropriate individual CRC calculation circuit blocks of different fixed widths are selected to process data of a given length less than the full, multiple-word fixed length. The approach becomes more complicated when the packet contains a number of data bits that is not an integer multiple of the CRC calculating circuitry width.

An example of a simple version of such a CRC architecture 150 is shown in FIG. 2B. Serial data is received by receiver 152 and is transferred to a logic/processing block 154 that detects and removes the header (and possibly other non-data information) from the data stream. (Other functional circuit blocks of architecture 150 are not shown for purposes of clarity in explaining the background.) The output of block 154 is input into a 1:n+1 demultiplexer (or switch) 158, which selects an output 165, 175 or 185x for processing by $2^m$ bit-wide CRC calculator 160, data word CRC calculator 170 or x bit CRC calculator 180, respectively, depending on the state of control signal CONTROL. The state of control signal CONTROL is determined by logic circuitry that detects the existence of remainder 110 and, optionally, determines the number of data words and/or data bits in remainder 110. CRC calculator 180 represents a series of 31 CRC calculators in parallel with one another, each configured to calculate a CRC for a different remainder length of from 1 bit to 31 bits (one word minus one bit). This configuration is intended to enable CRC calculations on a remainder of any length in a minimum number of clock cycles. Most of the time, data lines 102-110 are received by demultiplexer 158, and control signal CONTROL selects bus 165 for transferring data lines 102-108 to $2^m$ bit-wide CRC calculator 160, which can calculate a CRC on multiple data words in a single clock cycle. However, when remainder logic circuitry detects a remainder 110 having a length of at least one data word, control signal CONTROL changes state and selects bus 175 for transferring data line 110 to data word CRC calculator 170, which is configured to calculate a CRC on one data word in one clock cycle. When the remainder 110 has a length that is not an integer multiple of data words, remainder logic circuitry determines the number of data bits in remainder 110 in excess of any integer multiple of data words in the remainder, and selects the bus 185$x$ corresponding to the CRC calculator 185$x$ configured to calculate a CRC for the excess bit length in remainder 110. Thus, when remainder 110 contains more than one data word, it can take longer to calculate a CRC on remainder 110 than on a full-length, multiple-word data line. In one case, when m=7 and the remainder logic circuitry is configured to determine the number of data words in remainder 110, CRC architecture 150 may further comprise a fourth CRC calculator for calculating a CRC on a two-word-long block of data, to reduce the CRC calculation time in the cases where remainder 110 contains two or three data words.

While providing some improvement over the approach of FIGS. 1A-1B in calculation time, the approach of FIGS. 2A-2B is inefficient in terms of circuit use and/or chip area. A significant amount of chip real estate is dedicated to circuitry that is used infrequently or, in some cases, not at all (e.g., where a transmission protocol places restrictions on the number of words in the data packet). Such architectures also unnecessarily consume power to keep all of the CRC circuitry active, even when it is not in use. In many cases, some bus lengths to and from second, third and/or further CRC blocks are relatively long, and thus consume incrementally greater power when transmitting data or even staying active, in comparison with the main (e.g., $2^m$ bit) CRC block.

Needs therefore exist to maximize the operational efficiency and the functional circuit area efficiency of CRC circuitry and/or to further improve the CRC calculation speed, to keep up with ever-increasing demands for increased network speeds, smaller chip and board sizes and reduced power consumption.

SUMMARY OF THE INVENTION

Embodiments of the present invention relate to circuitry, architectures, systems and methods for checking data for transmission errors or determining if an information transmission error has occurred. The method generally comprises the steps of (a) partitioning the unit of digital data into one or more full data lines and a remainder, wherein each of the full data lines comprises a predetermined number of data blocks, each of the data blocks has a first fixed length, the predetermined number is an integer of at least 2, and the remainder has a length less than the predetermined number times the first fixed length; (b) if the remainder contains at least one data bit, adding to the remainder a padding vector having a length sufficient to generate a padded data line having the predetermined number of data blocks; and (c) performing error checking calculations on the full data lines and the padded data line. The circuitry generally comprises (a) a first logic circuit configured to detect non-data information; (b) a zero-fill circuit configured to replace at least a portion of the non-data information with a padding vector; and (c) an error detection circuit configured to (i) detect a transmission error in data portions of the information and a padded data portion of the information, the data portions and the padded data portion having a first fixed bit length, and (ii) combine the padding vector and/or a predefined vector with a remaining data portion of the information to form the padded data portion. The software generally includes a set of instructions configured to implement or carry out the present method. The architectures and/or systems generally comprise those that include a circuit embodying one or more of the inventive concepts disclosed herein or that are configured to practice one or more of the inventive methods or processes described herein.

The present invention advantageously provides CRC circuitry and a CRC architecture with (i) increased calculation speed and (ii) improved operational and functional circuit area efficiencies, thereby providing increased network speeds, smaller chip and IC package sizes, and reduced power consumption, thereby enabling smaller board designs and reduced power consumption and heat generation in systems containing circuitry implementing the present invention.

These and other advantages of the present invention will become readily apparent from the detailed description of preferred embodiments below.

BRIEF DESCRIPTION OF THE DRAWINGS

FIG. 3 is a diagram showing an exemplary embodiment of the present CRC architecture.

FIG. 9 is a flow chart for an exemplary computer-readable medium suitable for use in the present invention.

DETAILED DESCRIPTION OF THE PREFERRED EMBODIMENTS

Figure 1A:
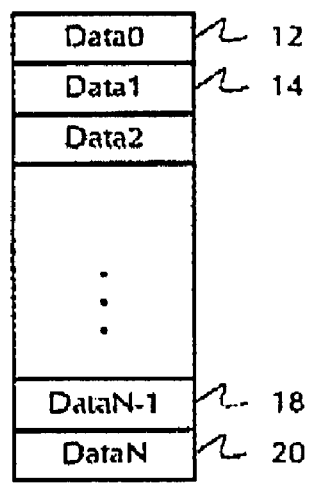
FIG. 1A is a diagram showing a conventional data packet for a network.
Figure 1B:
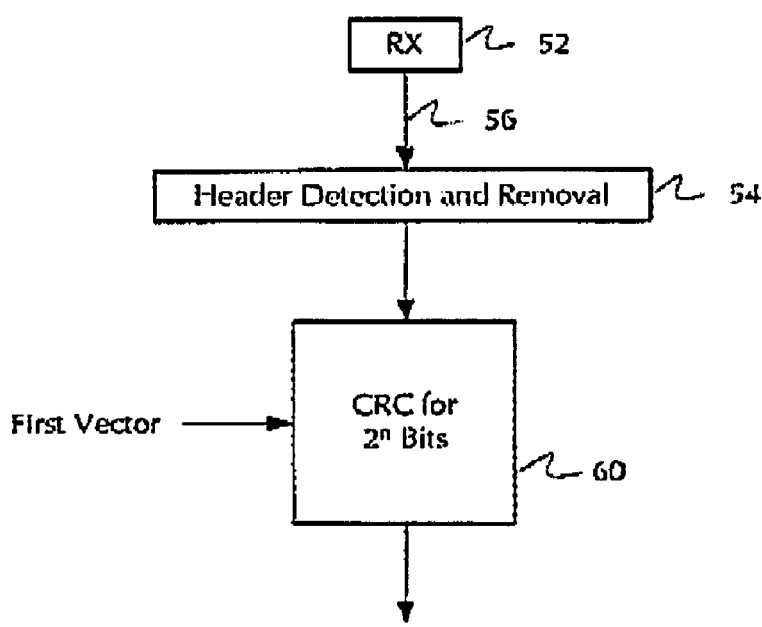
FIG. 1B is a block diagram showing conventional receiver circuitry for calculating a CRC on the data packet of FIG. 1A.
Figure 2A:
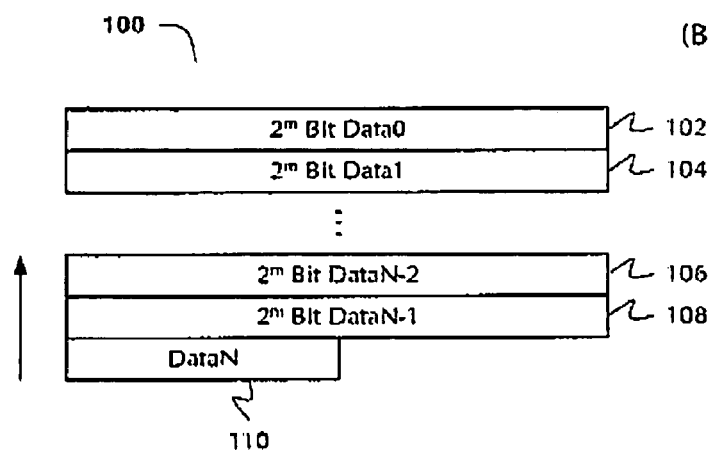
FIG. 2A is a diagram showing an alternative conventional network data packet.
Figure 2B:
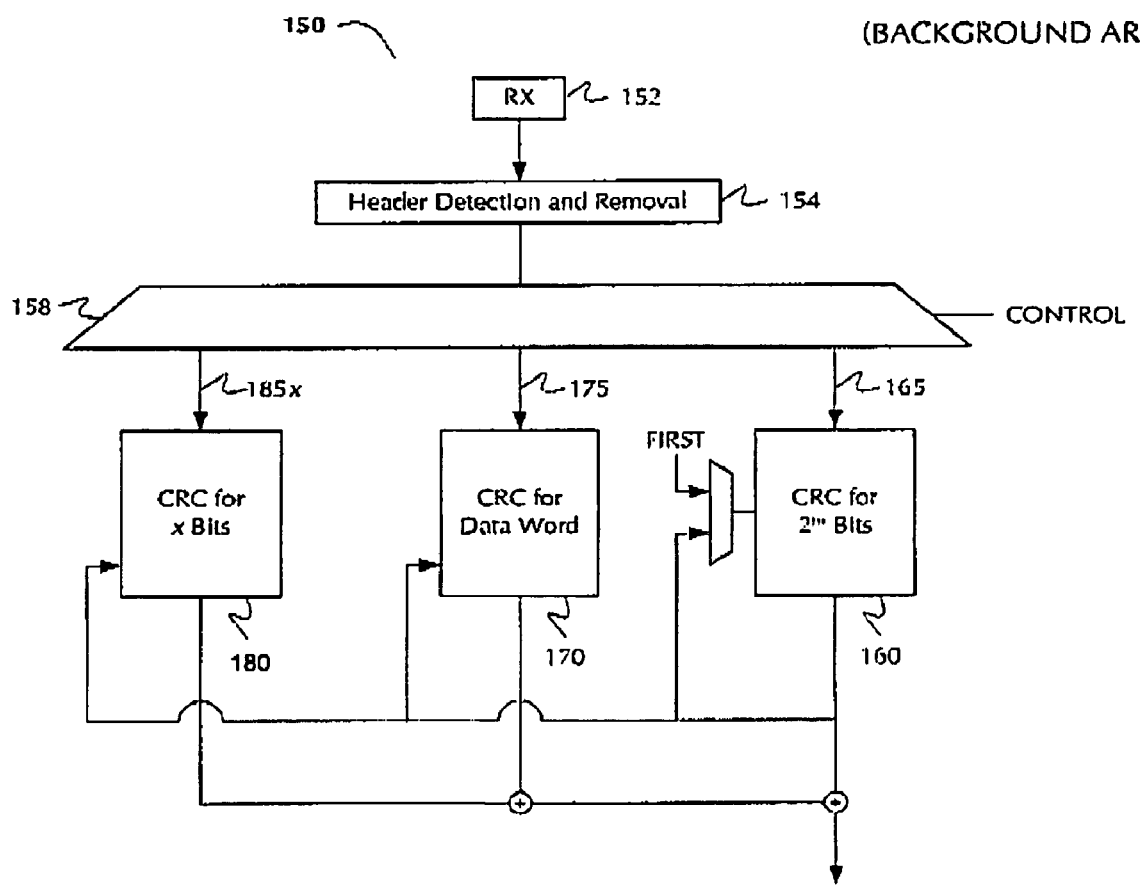
FIG. 2B is a block diagram showing receiver circuitry for calculating a CRC on the data packet of FIG. 2A.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the following groups of terms "data," "data stream," "waveform" and "information" may be used interchangeably, but the individual terms are also generally given their art-recognized meanings:

"connected to," "coupled with," "coupled to," "communicatively coupled to," and "in communication with;"

"circuit," "architecture," "circuit block" and "function(al) block;" and

"determine," "detect," "calculate," "check" and "find" (and grammatical variations thereof).

The acronym "CRC" refers to cyclic redundancy code, a cyclic redundancy check (e.g., the performance of a cyclic redundancy code calculation, or the result of performing such a calculation) and/or the act of calculating cyclic redundancy code or performing a cyclic redundancy check (sometimes known as "cyclic redundancy checking"), depending on the context of its use.

The present invention concerns methods, circuits, architectures and systems for determining digital data transmission errors. The method generally comprises the steps of (a) partitioning the unit of digital data into one or more full data lines and a remainder, wherein each of the full data lines comprises a predetermined number of data blocks, each of the data blocks has a first fixed length, the predetermined number is an integer of at least 2, and the remainder has a second length less than the predetermined number times the first fixed length; (b) if the second length is at least one bit long, adding a padding vector to the remainder, the padding vector having a length sufficient to generate a padded data line having the predetermined number of data blocks; and (c) performing error checking calculations on the full data lines and the padded data line.

A further aspect of the invention concerns a circuit and/or architecture for determining transmission errors in serial information, generally comprising (a) a first logic circuit configured to detect non-data information; (b) a padding circuit configured to replace at least a portion of the non-data information with a padding vector; and (c) an error detection circuit configured to (i) detect a transmission error in data portions of the information and a padded data portion of the information, the data portions and the padded data portion having a first fixed bit length, and (ii) combine the padding vector and/or a predefined vector with a remaining data portion of the information to form the padded data portion. Even further aspects of the invention concern a system for determining transmission errors in digital information, generally comprising the present circuit and/or architecture, and software configured to implement and/or encode one or more of the methods disclosed herein. The invention, in its various aspects, will be explained in greater detail below with regard to exemplary embodiments.

An Exemplary Method of Cyclic Redundancy Checking

In one aspect, the present invention relates to a method of checking a unit of digital data for a transmission error, comprising the steps of (a) partitioning the unit of digital data into one or more full data lines and a remainder, wherein each of the full data lines comprises a predetermined number of data blocks, each of the data blocks has a first fixed length, the predetermined number is an integer of at least 2, and the remainder has a second length less than the predetermined number of data blocks times the first fixed length; (b) if the remainder contains at least one data bit (i.e., the second length is at least one bit long), adding to the remainder a padding vector having a length sufficient to generate a padded data line having the same length as the full data lines (i.e., the predetermined number times the fixed length of the data blocks); and (c) performing error checking calculations on the full data lines and the padded data line. In preferred embodiments, the digital data to be partitioned comprises serial digital data, and/or the error checking calculations comprise (i) generating redundant error checking code from the full data lines and the padded data line and (ii) comparing the redundant error checking code with redundant error checking information transmitted with the unit of digital data. More preferably, the error checking calculations comprise cyclic redundancy check (CRC) calculations.

The digital data is transmitted in units and generally has a unit format that is conventionally used for data transmissions, such as a packet, a frame or a page. As is known in the art, packets, frames and pages may include both data and non-data information (as is discussed below). However, as discussed above, CRC calculations are performed only on data, so any non-data information in a packet, frame, page or other data-containing unit of information should be removed prior to performing error checking calculations. Naturally, the digital data may comprise a series or plurality of such data units, but the method is generally performed on an individual unit (and ideally, on each such unit). In any case, the unit of digital data is partitioned into one or more full data lines and a remainder. As a result, a full data line is generally smaller than a unit of data. However, since each full data line comprises at least 2 data blocks, a data block is necessarily smaller than a full data line. Generally, a data block is a (1/q) integer divisor of a data line, where q is 2 or more, preferably 4 or more. In one embodiment, q is 4.

Referring now to FIG. 3, a unit of digital data 230 is shown, comprising a plurality of full data lines 232-240 and a padded data line 242. Each of data lines 232, 234, 236, 238 and 240 has a fixed length. In the embodiment shown in FIG. 3, this fixed length is $2^n$ bits, where n is preferably an integer of from 3 to 10, more preferably of from 5 to 8. In one implementation, n is 7. Padded data line 242 comprises a zero fill portion 250 (one example of a padding vector) and a data portion 260. Data portion 260 generally comprises the remainder of the transmitted data, after accounting for all fixed length data lines 232-240. Zero fill portion 250 will be explained in greater detail below.

As described above, one disadvantage of conventional CRC methods and circuits is that separate circuits are used to perform CRC calculations on data blocks of different sizes. That can be a very inefficient process, but has generally been necessary in order to process units of data having a bit length that is not a multiple of the width of the CRC calculator. However, in one aspect, the present invention involves a method for performing CRC calculations on blocks of data having a uniform bit length, thereby enabling CRC on digital data using a single CRC calculating circuit or circuit block, while at the same time, taking advantage of the time savings of multiple block (e.g., multi-word) CRC processing. Generally, the present invention processes digital data in lines having a known and/or fixed length (e.g., data lines 232-240 in FIG. 3) and, to the extent necessary, adds a padding vector 250 having a length sufficient to generate a final, padded data portion having the known and/or fixed length (e.g., line 242 in FIG. 3). Thus, the method may further comprise removing a non-data portion of a transmitted information unit comprising the digital data, and inserting the padding vector (and in one embodiment, a zero-pad vector) therefor.

In one preferred embodiment, the transmitted information unit may comprise a data packet. As is known in the art, depending on the application, packets may have a variable length or a fixed length. Packets suitable for use in the present invention preferably comprise $(2^x \cdot y)+z$ words, wherein $2^x$ is the number of words in a line of data in the packet, x is an integer of from 0 to 4 (preferably from 1 to 3, and in one embodiment, 2), y is the number of lines of data in the packet (generally $\geq 1$, preferably $\geq 3$, more preferably $\geq 5$, and most preferably $\geq 7$), and z is an integer of less than $2^x$. Of course, the packet need not contain an exact integer multiple number of words or blocks. Where the packet contains a number of bits in excess of an exact integer multiple number of words or blocks, one simply adds a padding vector of sufficient length to form a padded line having the same length as the data lines. However in cases where the packet contains an exact integer multiple number of words or blocks, when z is at least 1, the length of the zero-pad vector is $(2^x-z)$ words. A data word generally comprises four (4) bytes of data, but the number of data bytes that make up a data word may vary, depending on the application. Thus, the fixed length of the data blocks making up a data line generally consist of $2^n$ bits, where n is an integer of from 3 to 6; preferably, n is 5. The fixed length of a data line generally comprises or consists of $2^m$ bits, where m is an integer of from 6 to 10, and m>n.

In a preferred implementation, the packets have a fixed length, in which case both y and z (as well as any number of bits in excess of the integer number of words) are constant values from packet to packet. When y and z are constant, the same padding vector 250 can be inserted into the padded data line for each packet. (When the padding vector is a zero fill vector, the padded data line may be considered to be a zero-padded data line.) When constant values for y and z are known at or before the time of circuit design, the known zero fill vector 250 can be implemented in hardware. However, even when the packets have a variable length, if the remainder consists of an integer number of words, the number of words in the remainder can be determined accurately in accordance with conventional techniques from information indicating whether the total number of data words in the packet (or other form of data unit) is an odd number or an even number.

Where packets may have a variable length, the number of excess data words and/or bits in the packet (i.e., those words and/or bits that are not present in sufficient number to complete a full line) may be determined, and an appropriate zero fill vector (e.g., one of padding vectors 212-218) may be selected based on the determination. For example, a conventional look-up or hash table 210 can store zero-fill vectors of various lengths (e.g., in the "exact word number" embodiment, PAD0 212 is 32 bits long, PAD1 214 is 64 bits long, PAD2 216 is 96 bits long, and PAD3 218 is 128 bits long), and the addresses of the look-up or hash table can be correlated to the outcome of the excess data word determination. For example, in an application where data is known to be transmitted in words only, the excess number of words can be determined (e.g., 0, 1, 2, ... $2^x-1$) and a complementary number of all-zero words can be added to the excess data words to form a complete, zero-padded data line 242. Therefore, the present method may further comprise the step of selecting the zero-pad vector based on information about the number of data blocks in the remainder.

The hash table or look-up table 210 may comprise an array of non-volatile data bit storage elements (e.g., mask- or laser-programmed ROM, EPROM, EEPROM or flash memory). The table 210 may have a series of addresses corresponding to unique padding vectors 212-218, or logic may be configured to choose one or more sections of a padding vector having a full line length (e.g., a one-line-long shift register stores a series of binary zeros, an appropriate length of which is shifted out in response to an instruction from the logic). However, an "all zeros" padding vector, while preferred, is not the only vector suitable for the present padding vector. Any other vector that, in combination with the predefined vector, can result in a known (and in a preferred embodiment, an "all ones") CRC calculation state is suitable.

In the "integer multiple of words" embodiment, logic elsewhere in the receiver may be configured to determine whether the unit of digital data includes a remainder, and if so, how many data words are in the remainder. Such logic may comprise a counter configured to count the number of bits, bytes or words of data in a transmitted information unit, or it may comprise a simple decoder that decodes appropriately designated "remainder length" information bits in the non-data information transmitted with the unit of data. Thus, the present method may further comprise the step(s) of determining whether the unit of digital data includes the remainder and/or determining the number of data blocks or words in the remainder.

In preferred implementations, the packet or frame conforms to a conventional network protocol and/or protocol stack, such as OSI, ASN.1 (Abstract Syntax Notation 1), BER (Basic Encoding Rules), CMIP (Common Management Information Protocol), CMIS (Common Management Information Services), X.400 (Message Handling System, or MHS), X.500 (Directory Service), ANSI/NISO Z39.50, TCP, IP and/or TCP/IP. In addition to CRC information, the packet or frame header may further include a start-of-packet (SOP) sequence, source and/or destination addresses, and/or information on the packet or frame format and/or amount of data (e.g., the number of data words) in the packet or frame. In a preferred implementation, the transmitted information unit (including the unit of data) comprises a packet.

In a further embodiment, the present method may further comprise (i) receiving the digital data and/or (ii) removing the non-data portion(s) of the transmitted information unit (which may comprise removing the packet or frame header) and inserting a padding vector having a length equal to that of a data line minus the remainder for the packet header. In a preferred embodiment where the digital data is part of a packet, the combination of the remainder and the padding vector has the same fixed length as each of the full data lines, and the checking step comprises checking each of the full data lines and the padded data line with a common circuit.

In the present method, the checking step may comprise any conventional error detection process or technique, such as CRC, Hamming code or a "checksum" operation. Preferably, checking data for a transmission error comprises performing a cyclic redundancy checking (CRC) operation. As is explained in greater detail below, an advantage of the present invention is that the checking step may comprise checking each of the full data lines and the zero-padded data line using a common error checking circuit (preferably, a single CRC calculator). The present method may also further comprise acknowledging receipt of the data upon or in response to determining that there was no error in the data portions of the data (e.g., by issuing a conventional ACK command or signal when the CRC calculated from the data portions of the data matches the CRC in the non-data portion of the information), not acknowledging receipt and/or requesting retransmission of the information upon or in response to determining that there was an error in the data portions of the information (e.g., by doing nothing or by issuing a conventional NAK [negative acknowledge] command or signal when the CRC calculated from the data portions of the information does not match the CRC in the non-data portion of the information), reassembling the data packet after the CRC calculation, etc.

In a further embodiment, one may determine that there was no error in the data portions by performing a CRC on either (1) the calculated CRC, or (2) a vector consisting of the transmitted data, the predefined vector, the padding vector (if present) and the transmitted CRC, in that order. These techniques are described in greater detail in application Ser. No. 10/795,003, filed on Mar. 3, 2004 and entitled "Method(s), Architecture(s), Circuits, and Systems for Checking Error Determinations", the relevant portions of which are incorporated herein by reference. In either error determining technique, if the final CRC calculation gives an "all zeros" result, then there was no error. If the result is anything other than zero, then there was an error.

Exemplary Circuits

A further aspect of the invention relates to a circuit for determining a data transmission error, comprising (a) a data partitioning circuit configured to partition a unit of the digital data into (i) one or more full data lines comprising a plurality of data blocks, each data block having a first fixed length, and (ii) a remainder, if the unit of digital data is not partitionable into an integer number of the data lines; (b) a padding circuit configured to add a padding vector to the remainder, if present, to generate a padded data line having a length equal to that of the plurality of data blocks; and (c) an error detection circuit configured to (i) receive the full data lines and the padded data line, and (ii) detect a transmission error in the unit of the digital data from the full data lines and the padded data line.

In one embodiment, the padding circuit comprises (i) a storage circuit configured to store a set of padding vectors of varying lengths; and (ii) a padding vector selector, configured to select one of the padding vectors. For example, the storage circuit may comprise a conventional hash table or a look-up table, as described above. In further embodiments, the padding vector selector selects the one of the padding vectors in response to a remainder information signal, and a state of the remainder information signal corresponds to a length of the remainder. The circuit may further comprise a logic circuit configured to generate the remainder information signal. As for the exemplary method above, in one embodiment, the padding vector is a zero-pad or zero fill vector.

As described above for the present method, in the present circuit, the first fixed length of each data block is $2^n$ bits, where n is an integer of from 3 to 7, preferably 4 to 6, and in one implementation, n is 5. Furthermore, each of the full data lines and the padded data line may comprise $2^x$ data blocks, where x is an integer of from 1 to 4.

As for the method, in the present circuit, the unit of digital data may comprise a portion of a conventional packet, frame or page, preferably a packet or frame, preferably a packet, and each of the data blocks may consist of a data word (e.g., n=5), although other embodiments are certainly possible, as discussed above. Therefore, in various embodiments, the present circuit is configured such that each of the full data lines and the padded data line has a second fixed length, and the second fixed length is an integer multiple of the first fixed length. For example, the second fixed length may comprise or consists of $2^m$ bits, where m is an integer of from 6 to 10, preferably 7 or 8, and in one implementation, m is 7.

In another embodiment of the present circuit, the data partitioning circuit may comprise a deserializer (see FIGS. 5-7 and the discussion thereof below) and/or a plurality of data bit storage elements configured to store one or more of the plurality of data blocks. The plurality of data bit storage elements may comprise one or more rows, columns, banks, groups, series or arrays of flip-flops, latches or registers having a width equal to or a $½^x$ (where x is as defined above) divisor of the full data lines (e.g., the second fixed width above). See, e.g., Mano, "Digital Design," 3rd ed., Prentice Hall, Upper Saddle River, New Jersey (2002), chapter 6, the relevant portions of which are incorporated herein by reference.

In a particularly preferred embodiment, the error detection circuit comprises a cyclic redundancy checking (CRC) circuit. As explained above, the full data lines and the padded data line generally have a common (i.e., the same) bit length. This feature enables a single CRC circuit to calculate a CRC on transmitted data units of any length, thereby reducing the chip area dedicated to CRC, increasing the utilization efficiency of the circuitry on the chip, and reducing power consumption. Thus, another preferred embodiment of the present circuit and/or architecture is one in which the error detection circuit comprises a cyclic redundancy checking (CRC) circuit. More preferably, the common bit length of the full data lines and the padded data line is $2^m$ bits, where m is an integer of from 6 to 10, even more preferably 7 or 8. In one implementation, m is 7.

Figure 4:
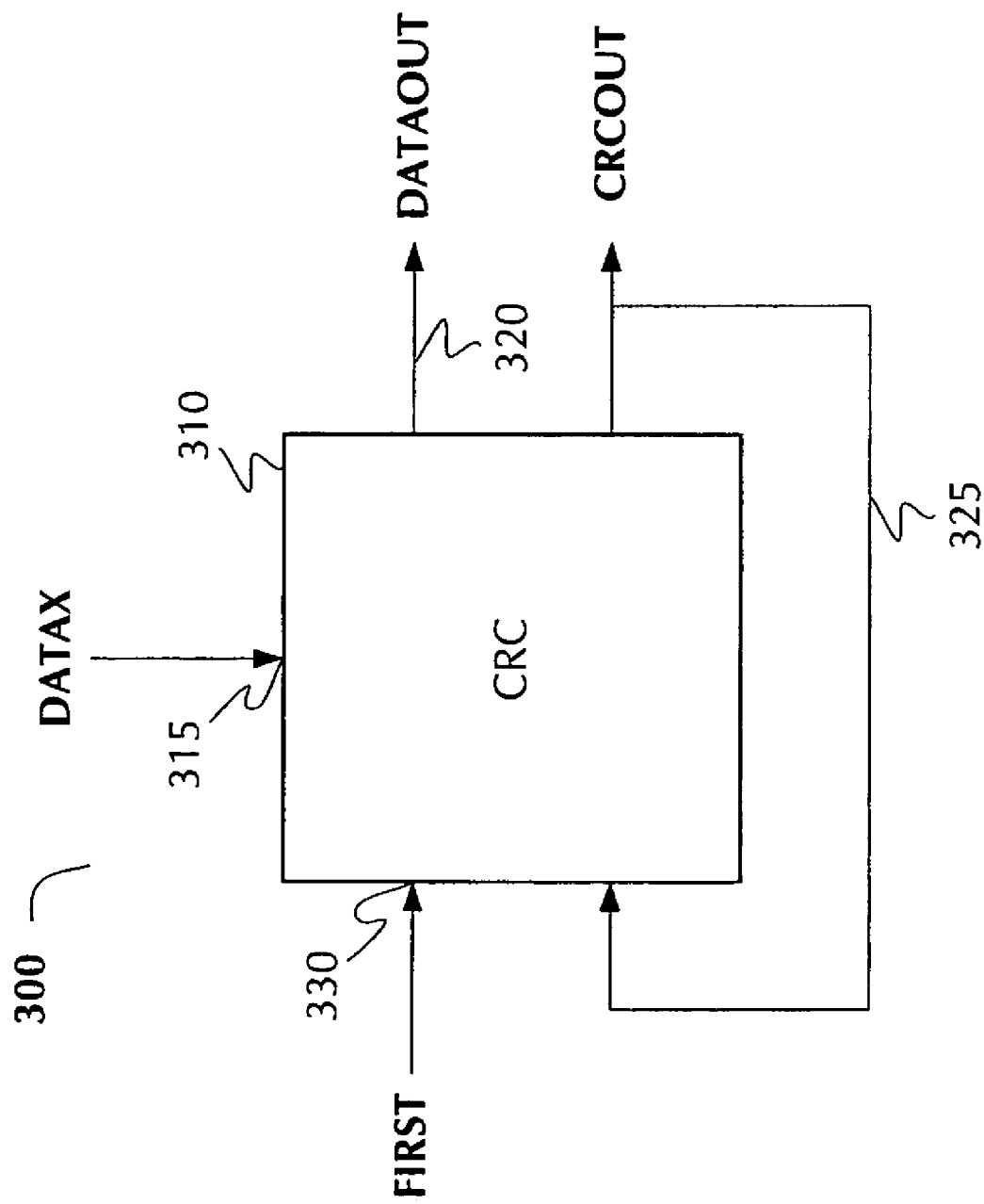
FIG. 4 is a diagram of an exemplary CRC circuit configured to practice the present invention.

FIG. 4 shows an exemplary CRC circuit 300, comprising CRC calculator block 310, data input 315, data output 320, CRC feedback 325 and initial vector input 330. CRC calculator block 310 receives a predefined, initial vector FIRST (similar to the "First Vector" described in Ser. No. 10/690,780, filed Oct. 21, 2003, which is typically a series of all "ones" in digital or binary logic [e.g., 1111 ... 1], but which can be any vector that, in combination with the padding vector, provides an "all ones" state as a result of a CRC calculation on the combined first vector and padding vector) at input 330 and data lines DATAX at input 315. CRC calculator block 310 is configured to calculate a CRC on data having the same length (or width) as each of the full data lines and the padded data line (e.g., referring to FIG. 3, data lines 232-240 and zero-padded data line 242), and is thus considered $2^m$ bits wide. CRC calculator block 310 thus performs a CRC calculation on $2^m$ bits of data (or on zero-padded data line 242) in a single clock cycle. After line-wise CRC calculations, zero-padded data line 242 and data lines 232-240 are output onto DATAOUT bus 320, and the resultant CRC calculations are output onto bus 325 CRCOUT, which is also fed back into CRC calculator block 310.

The operation of the CRC calculator block 310 is as follows. Upon receiving an appropriate control signal from logic or a functional block elsewhere in the receiver indicating that a data unit is about to be (or at least the first line of the data unit has been) transferred to CRC calculator block 310, predefined or initial vector FIRST is latched into CRC calculator block 310, and a first CRC calculation is performed thereon in a first clock cycle, and the CRC calculated on first vector FIRST is output as CRCOUT on bus 325. In the second clock cycle, a zero-padded data line 242 is received by CRC calculator 310 for a $2^m$ bit CRC calculation. After the CRC calculation, zero-padded data line 242 is output onto DATAOUT bus 320, the CRC calculated on zero-padded data line 242 is conventionally combined with the CRC calculated on first vector FIRST, then the combined CRC is output onto CRCOUT feedback bus 325. In the third cycle, the CRC on data line DATA1 232 is calculated, then combined with the previous CRC on or from feedback bus 325 to generate a next CRC calculation state, which is then output onto feedback bus 325. In subsequent cycles, CRCs are calculated on each of data lines DATA2 through DATAN 234-240 and combined with the previous combined CRC. This CRC calculation cycle is repeated until the calculation on DATAN is combined with the previous CRC and a final CRC calculated on the entire set of the first vector FIRST, zero-padded data line 242 and full data lines 232-240 is output on CRCOUT bus 325, then a control signal that indicates the end of the data unit (which may be generated by the same or different logic configured to determine the end of the data portion of the transmitted information unit) instructs a downstream functional block (such as a data processor) to add or insert the final CRC back into the data or information stream for subsequent receipt and/or processing.

Exemplary Architectures

A further aspect of the invention relates to an architecture for determining an information transmission error, generally comprising the present circuit, and optionally, one or more additional functional blocks described herein and/or conventionally found or used in a receiver for digital data communications. As explained above, the full data lines and the zero-padded data line generally have a common (i.e., the same) bit length. This feature enables a single CRC circuit to calculate a CRC on data of any length, thereby reducing the receiver chip area dedicated to CRC, increasing the utilization efficiency of the circuitry on the receiver, and reducing power consumption (both in the receiver and in a larger system that includes such a receiver). Thus, another preferred embodiment of the present circuit and/or architecture is one in which the error detection circuit comprises a cyclic redundancy checking (CRC) circuit. More preferably, the common bit length of the full data lines and the zero-padded data line is $2^m$ bits, where m is an integer of from 6 to 10, even more preferably from 6 to 8. In one implementation, m is 7.

In a preferred application, the information received and/or processed by the present architecture comprises a plurality of packets. Preferably, each of the packets has a first fixed length, and the non-data portion of the packet comprises a packet header having a second length (which may be variable or fixed) less than or equal to the first fixed length. In preferred embodiments, the packet header has a fixed length, and the fixed length of the header is less than the length of the packet. The fixed length of the header may consist of $2^n$ bits, where n is an integer of from 3 to 8, preferably 4 to 7. In one implementation, n is 5.

Figure 5:
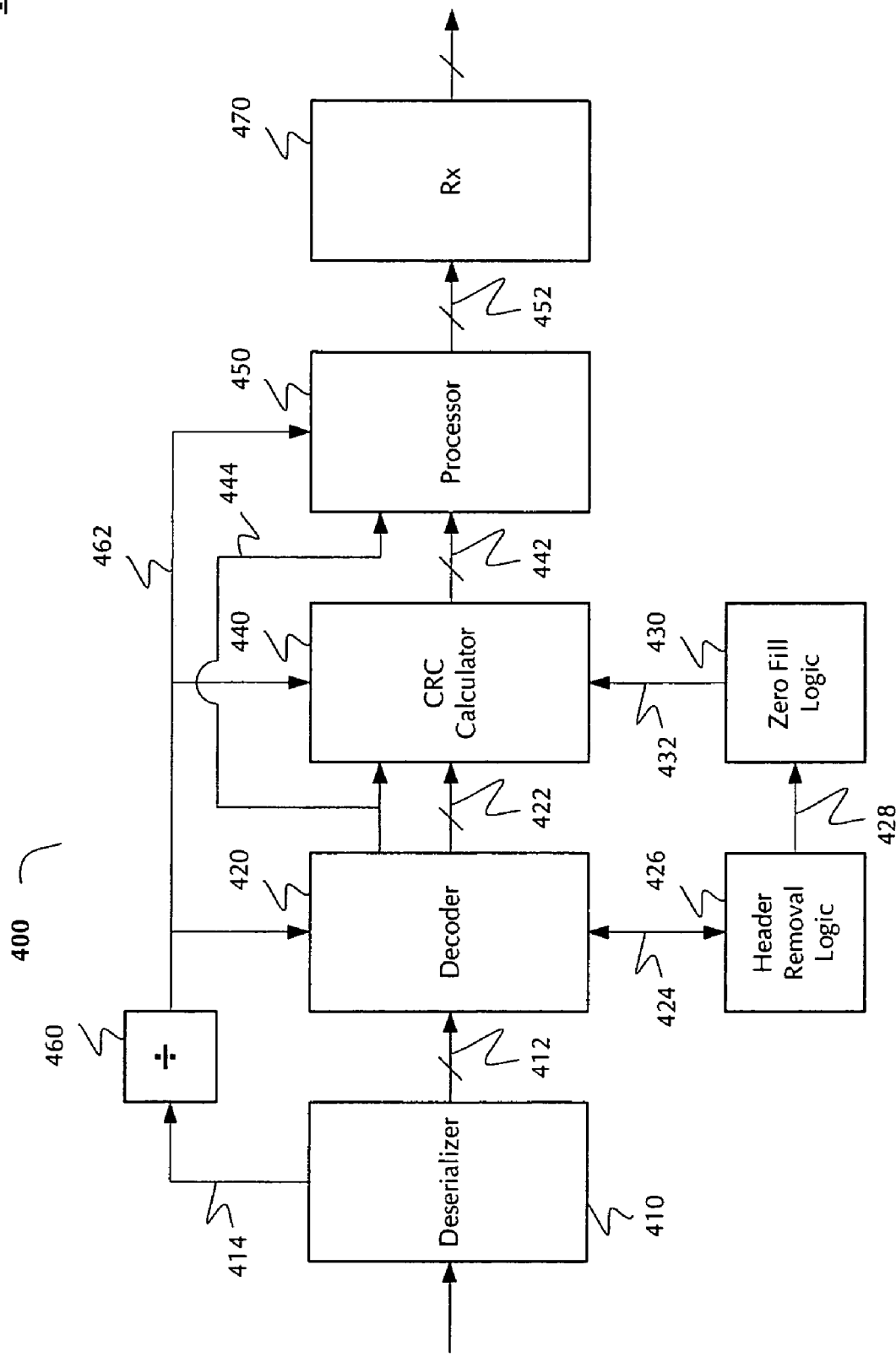
FIG. 5 is a box level diagram of an exemplary receiver architecture, embodying the present invention.

FIG. 5 shows a block diagram of an architecture and/or circuit suitable for use as a receiver implementing the present invention. Receiver 400 comprises a deserializer 410, a decoder 420, header removal logic 426, zero fill logic 430, CRC calculator 440, processor 450 and receiver functional block 470. Receiver 400 may further comprise a divider 460 configured to divide a clock signal recovered from serial information received by the receiver 400, typically by a clock recovery circuit located in the deserializer 410 (as shown in FIG. 5) or elsewhere in the receiver 400.

Deserializer 410 is generally configured to convert serial digital information received by the receiver 400 into parallel information for processing by downstream circuitry, such as decoder 420, header removal logic 426, zero-fill circuit 430 and CRC circuit 440. Thus, the present architecture may further comprise a deserializer configured to convert serial information into parallel information for processing by the non-data information detection circuit and the error detection circuit.

The present architecture may further comprise a decoder configured to decode at least part of the non-data information accompanying the unit of data. In certain embodiments, the non-data information comprises a header, and in other embodiments, a header and a trailer. For example, when the non-data information comprises a packet, the non-data information generally comprises a packet header, and when the non-data information comprises a frame, the non-data information generally comprises a frame header and a frame trailer.

As described above, in some applications, the header includes non-data information such as a start-of-packet (SOP) or start-of-frame (SOF) sequence, source and/or destination addresses, and/or information on the format and/or amount of data in the information block (e.g., packet or frame). The decoder is generally configured to perform a number of identification, detection and/or decoding functions, such as detect a SOP and/or SOF sequence, determine the format of the information block, determine the amount of data (e.g., in lines, words, bytes and/or bits) in the information block, and decode source and/or destination addresses. For example, referring to FIG. 5, decoder 420 may receive parallel information from deserializer 410 on bus 412 (which may be $2^p$ bits wide, where p is preferably an integer of from 2 to 7, more preferably of from 3 to 5), decode a destination address, then send an appropriate single- or multi-bit signal to receiver block 470 for appropriate routing of the information through receiver 400 towards the desired (e.g., predefined and/or predetermined) destination. The trailer typically contains an end-of-frame (EOF) sequence, and possibly information relating to the quality of the data (e.g., whether or not errors were identified in the data, what kind of error, and/or where the error may have been introduced), the priority of the information, the reliability of the data source, or other "tag" type of information relating to the quality and/or reliability of the data, its source and/or its transmission(s) through the network.

Upon detection of non-data information (e.g., a SOP or SOF sequence), decoder 420 also transmits an appropriate control signal to header removal block 426 along bus 424, which may be single-bit or multi-bit, bidirectional or comprised of two (or more) unidirectional busses. Header removal logic 426 sends a first control signal back to decoder 420 to not send non-data information to CRC calculator 440, and a second control signal along bus 428 (which may be single- or multi-bit, and is preferably multibit when zero fill logic 430 includes a look-up table) to zero fill logic 430, which then transmits to CRC calculator 440 (i) a zero-pad vector of appropriate length and/or (ii) the known, predefined vector (e.g., first vector FIRST, discussed above with respect to FIG. 4) that may initiate the CRC calculation. Decoder 420, header removal logic 426 and/or zero fill logic 430 (preferably decoder 420) also sends to CRC calculator 440 a control signal configured to instruct CRC calculator 440 to select the appropriate vector from either parallel bus 422 (i.e., data portions 216 and 232-240 from decoder 420) or bus 432 (i.e., zero-pad vector and/or the predefined vector from zero fill logic 430) for the CRC calculation. Bus 432 may be serial or parallel.

Thus, the present circuit and/or architecture may further comprise (i) a second logic circuit configured to remove the non-data portion of the transmitted information and insert the zero-padded data for the non-data portion, and/or (ii) a deserializer configured to convert serial information into parallel information for processing by the non-data information detection circuit and the error detection circuit, wherein the decoder is further configured to decode at least part of the parallel information. It is well within the abilities of one skilled in the art to design and use logic configured to remove from a serial or parallel data stream non-data information that has been identified as such, and insert the zero-padded data (or any other vector, for that matter) for the non-data information.

CRC calculator 440 is configured to perform a conventional CRC operation, but generally on data having a single, uniform bit length (or, more literally, width, if performed on parallel data; see, e.g., exemplary CRC circuit 300 of FIG. 4 and the corresponding discussion thereof above). Thus, CRC calculator 440 typically includes only a single CRC calculating circuit configured to calculate a CRC on data of a fixed bit length/width, preferably where the fixed bit length/width is $2^m$ bits, where m is an integer of from 6 to 10, more preferably from 6 to 8. CRC calculator 440 is also generally configured to determine whether the CRC it calculates matches the CRC transmitted with the information to receiver 400. Generally, in the implementation of FIG. 5, (i) zero-padded data line 242, (ii) full data lines 232-240, and (iii) the CRC calculated by CRC calculator 440 are all output from CRC calculator 440 to processor 450 along parallel bus 442 either $2^p$ or $(2^p+1)$ bits at a time (where the extra bit indicates whether the calculated CRC matches the transmitted CRC). A signal indicating whether the calculated CRC matches the transmitted CRC or not may also be sent from CRC calculator 440 to processor 450, or processor 450 may simply comprise logic circuitry configured to perform such a determination (e.g., comprising a conventional XOR or XNOR gate-based parity generator and/or parity checker; see, e.g., Mano, pp. 97-99, incorporated herein by reference).

The present architecture and/or architecture may further comprise a processor configured to process the data portions of the information received from the error detection circuit. Processor 450 is generally configured to perform any conventional data processing operation on either or both of the data portions and the non-data portions of the digital information, such as data filtering, signal equalizing, bit width adjusting, etc. In one embodiment, the processor is further configured to reassemble the packet header and the data portions of the information. In such an embodiment, the header information removed from the packet in decoder 420 will be transmitted to processor 450 on bus 444, which may be a single- or multi-bit bus.

After processing the information received from CRC calculator 440 and/or decoder 420, the information is output on parallel bus 452 to receiver block 470. Receiver block 470 is conventional, and is generally configured to perform conventional receiver functions, such as data buffering, data signal routing, data signal switching, etc. When configured to buffer data, the receiver block 470 may comprise a conventional first-in-first-out (FIFO) memory or a conventional memory controller. When configured to route or switch data signals, the receiver block 470 may comprise a conventional switch array or crossbar array.

Figure 6:
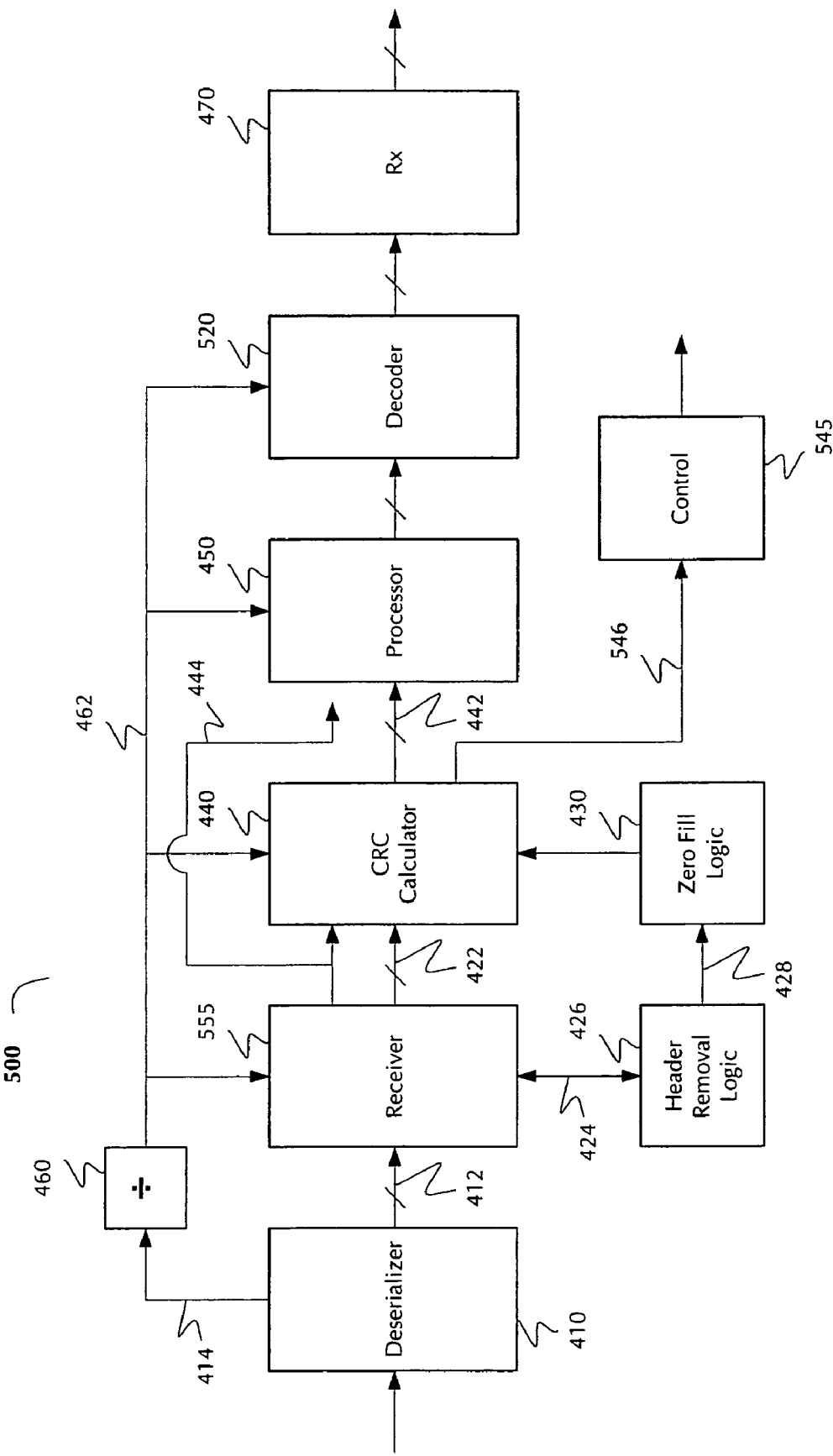
FIG. 6 is a box level diagram of a second exemplary receiver architecture, embodying the present invention.

FIG. 6 shows a second embodiment of a receiver architecture 500 configured to implement the present invention, with a few changes. Notably, decoder 520 is relocated downstream from processor 450, and thus, receives an output from processor 450 as an input. However, decoder 520 generally performs the same or similar functions as decoder 420 in FIG. 5, except for functions that are allocated to receiver block 555.

Receiver block 555 now receives deserialized information on parallel bus 412 from deserializer 410. However, the function(s) of receiver block 555 are somewhat simplified relative to decoder 420 (see FIG. 5 and the description above). Receiver block 555 is generally configured to detect SOP and/or SOF sequences and/or CRC information, exchange information with and/or receive instruction(s) from header removal logic 426, remove non-data information from the data stream to enable CRC calculator 440 to perform a CRC calculation on the data, and transmit non-data information to processor 450. However, receiver block 555 generally does not decode certain information, such as source and destination addresses, information format and/or transmission protocol, etc. Such functions are generally reserved for the decoder 520.

FIG. 6 also includes a control block 545 that receives information and/or instructions from CRC calculator 440 on bus 546 (which may be single- or multi-bit). In its simplest embodiment, CRC calculator 440 sends a single-bit status signal on bus 546 to control block 545, to indicate whether the calculated CRC matches the transmitted CRC (wherein the status signal has a first predetermined state) or not (wherein the status signal has a second predetermined state). In this embodiment, CRC calculator 440 further comprises logic circuitry configured to (i) determine whether the calculated CRC matches the transmitted CRC or not, and (ii) generate a signal indicating the result of such a determination.

When the calculated CRC matches the transmitted CRC, it is an indication that the error detection circuit detected no error in the data unit, including the data portion of the zero-padded data line, and control block 545 may transmit one or more control signals to other circuitry, enabling such other circuitry to perform predefined functions and/or operations. When the calculated CRC does not match the transmitted CRC, it is an indication that the error detection circuit detected an error in the transmitted data unit, and control block 545 may transmit one or more control signals (which may be discrete control signals or may be a different state of the same control signal) to other circuitry, either (i) disabling some or all of such other circuitry and/or (ii) instructing some or all of such other circuitry to perform one or more different predefined functions and/or operations.

Thus, in further embodiments, the present architecture may further comprise a control circuit configured to transmit a control signal in response to an error detected by the error detection circuit in the unit of data. For example, the control circuit may be configured to transmit (i) a first control signal in response to the error detection circuit detecting an error in the data, and (ii) a second control signal in response to the error detection circuit detecting no error in the data (i.e., the full data lines and the data portion of the zero-padded data line). For example, control circuit 545 may (a) generate a conventional ACK signal and transmit the same to the external information transmitter to acknowledge receipt of the transmitted information in response to CRC calculator 440 determining that there was no error in the data (e.g., when the calculated CRC matches the transmitted CRC); (b) do nothing or transmit a conventional NAK signal to the external information transmitter to indicate that the transmitted data may be corrupted and/or to request retransmission of the information in response to CRC calculator 440 determining that there was an error in the data (e.g., when the calculated CRC does not match the transmitted CRC); (c) instruct processor 450 to reassemble the data packet after the CRC calculation and/or instruct receiver block 470 to buffer and/or route the data, etc.

Figure 7:
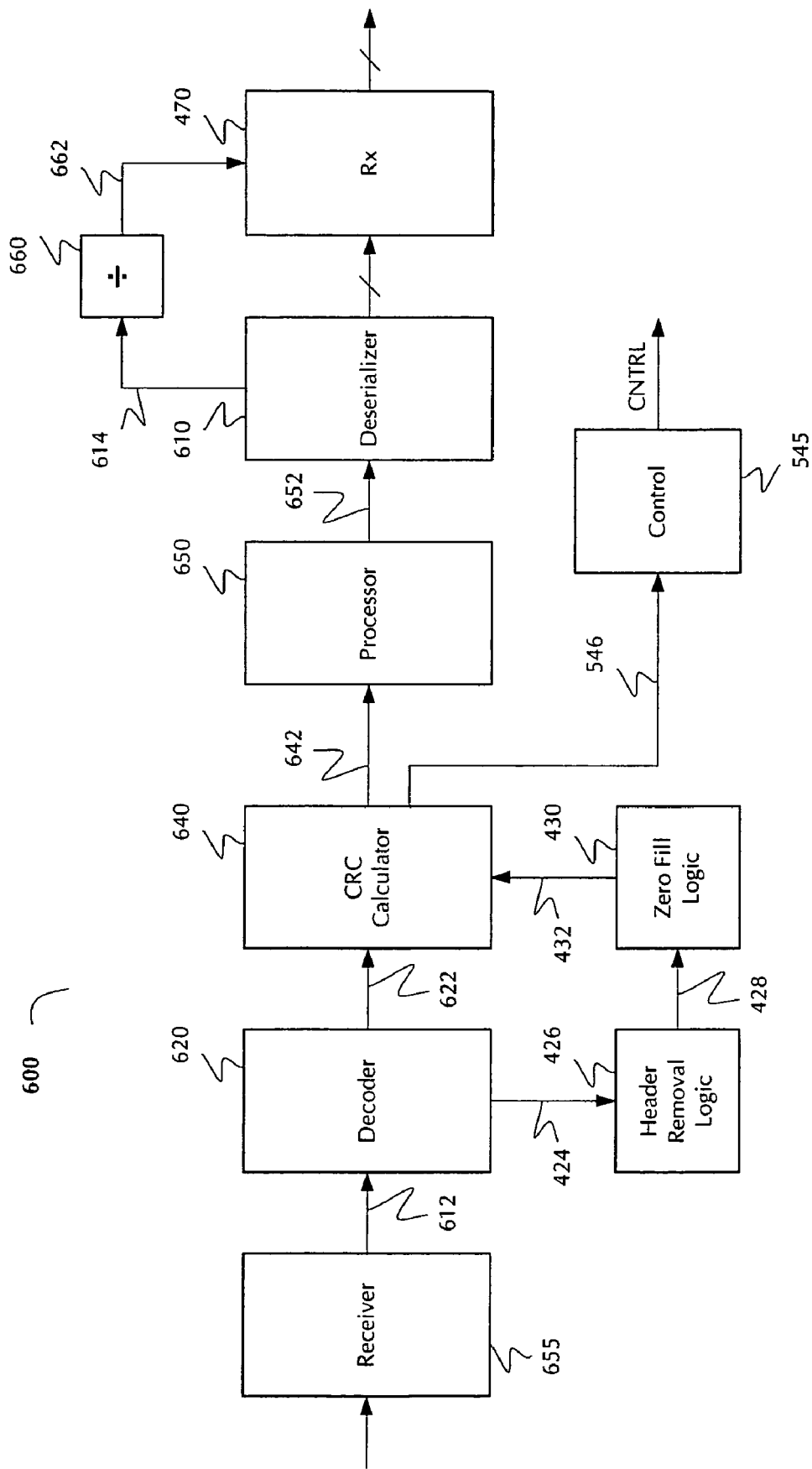
FIG. 7 is a box level diagram of a third exemplary receiver architecture, embodying the present invention.

FIG. 7 shows yet another embodiment of a receiver architecture 600 in which the decoder 620 may be configured to receive (and/or decode and/or otherwise process) serial information. This architecture is essentially the same as that of FIG. 6, but in which busses 612, 622, 642 and 652 are serial, rather than parallel, and in which decoder 620, CRC calculator 640 and processor 650 operate on serial data or serial information, rather than parallel data or parallel information. Such circuit blocks are conventional and known to those skilled in the art. However, it is worth noting again that serial CRC calculator 640 generally contains only a single CRC calculating circuit that operates on data lines having a uniform, consistent and/or common bit length.

Exemplary Software

Although the description herein tends to focus on methods and hardware (e.g., architectures, systems and/or circuits), the present invention also includes a computer program and/or software, implementable and/or executable in a general purpose computer or workstation equipped with a conventional digital signal processor, configured to perform one or more steps of the method and/or one or more operations of the hardware. Thus, a further aspect of the invention relates to software that implements the above method and/or algorithm. For example, the invention may further relate to a computer program, computer-readable medium or waveform containing a set of instructions which, when executed by an appropriate signal processing device, is configured to perform the above-described method.

For example, the computer-readable medium may comprise any medium that can be read by a signal processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional network cable, a conventional optical data transmission cable, or even air or a vacuum (e.g., outer space) for wireless signal transmissions. The waveform and/or code are generally digital, and are generally configured for processing by a conventional digital data processor (e.g., a microprocessor, microcontroller, or logic circuit such as a programmable gate array, programmable logic circuit/device or application-specific [integrated] circuit).

FIG. 9 is a flow chart 800 for an exemplary computer-readable medium suitable for use in the present invention. After receiving transmitted data (step 810), the set of instructions includes instructions to partition the data into full, fixed length data lines and a remainder (step 820), determine if the remainder is at least one bit long (step 830), and if so, determine the length of the remainder (step 832), then select a padding vector and add it to the remainder (step 834) so that the resulting padded data line has the same fixed length as the full data lines, and perform error checking calculations on the full data lines and padded data line (step 840). Further instructions in the set include instructions to compare the final error checking calculation to transmitted error code (step 850), determine if the final error checking calculation matches the transmitted error code (step 860). If so, the set of instructions may instruct the CRC circuit to indicate that there is no error (result 862), and if not, that there is an error (result 864).

The System and Network

A further aspect of the invention concerns a receiver, comprising the present circuit and/or architecture; a processor in communication with the circuit and/or architecture, configured to process the digital data; and a clock recovery circuit configured to recover a clock signal from serial data received by the receiver. In preferred embodiments, the receiver is embodied on a single integrated circuit.

In further embodiments, the receiver may further comprise a divider configured to divide the recovered clock. For example, each of FIGS. 5 and 6 show a divider 460 configured to receive a recovered clock 414 from deserializer 410 and provide a divided clock signal 462 to receiver functional blocks downstream from deserializer 410 (e.g., decoder 420, CRC calculator 440 and processor 450 in FIG. 5). FIG. 7 shows a similar divider 660, configured to receive a recovered clock 414 from deserializer 410 and provide a divided clock signal 462 to receiver functional blocks downstream from deserializer 410 (e.g., decoder 420, CRC calculator 440 and processor 450). The value by which a divider divides a recovered clock may be a fraction of any integer of 1 or more divided by any integer of 2 or more. Generally, the divided clock signal has a frequency suitable for operation of the downstream functional blocks (e.g., from 50 to 500 MHz, typically about 75, 83, 100, 125, 133, 166, 200, 233, 250 or 266 MHz).

In other embodiments of the present receiver, the processor (e.g., processor 450 in FIGS. 5-6 or 650 in FIG. 7) may be configured to (1) process the full data lines and the zero-padded data line received from the error detection circuit, and/or (2) assemble (i) non-data information from the packet or frame and (ii) at least part of the digital data. Alternatively and/or additionally, the data partitioning circuit may comprise a deserializer (e.g., deserializer 410 in FIGS. 5-6 or 620 in FIG. 7) configured to convert serial digital data into parallel digital data for processing by the error detection circuit; and/or the receiver may further comprise (a) a decoder (e.g., decoder 420 in FIG. 5, decoder 520 in FIG. 6 or decoder 620 in FIG. 7) configured to decode at least part of the non-data information and/or (b) a logic circuit configured to (i) receive the padded data line from the error detection circuit and (ii) remove the padding vector from the padded data line. In even further embodiments, the error detection circuit comprises a cyclic redundancy checking (CRC) circuit.

As for other aspects of the present invention, the unit of digital data received and/or processed by the present receiver may comprise a packet or frame; each of the data blocks may comprise or consist of a data word (where the data blocks comprise a data word, the data word may further include one or more parity bits); and/or each of the full data lines and the zero-padded data line has a second fixed length, and the second fixed length is an integer multiple of the first fixed length (and preferably, the second fixed length consists of $2^n$ bits, where n is an integer of from 6 to 10).

A further aspect of the invention concerns a system for transferring data on or across a network. The system generally comprises the present receiver; at least one transmitter in communication with the receiver, the transmitter being configured to transmit serial information to the receiver; and at least one receiver port in communication with the receiver for receiving the serial information. In preferred embodiments, the error detection circuit in the receiver comprises a cyclic redundancy checking (CRC) circuit. In such embodiments, the transmitter may further comprise (i) a CRC generator configured to generate CRC information from a data portion of the serial information and/or (ii) a transmitter processor configured to add the CRC information to or insert the CRC information in the serial information. Furthermore, the receiver may further comprise a control circuit configured to generate a control signal in response to the error detection circuit detecting at least one of an error and no error in the unit of digital data, and the system may further comprise a control bus configured to transmit the control signal from the receiver to the transmitter.

Figure 8:
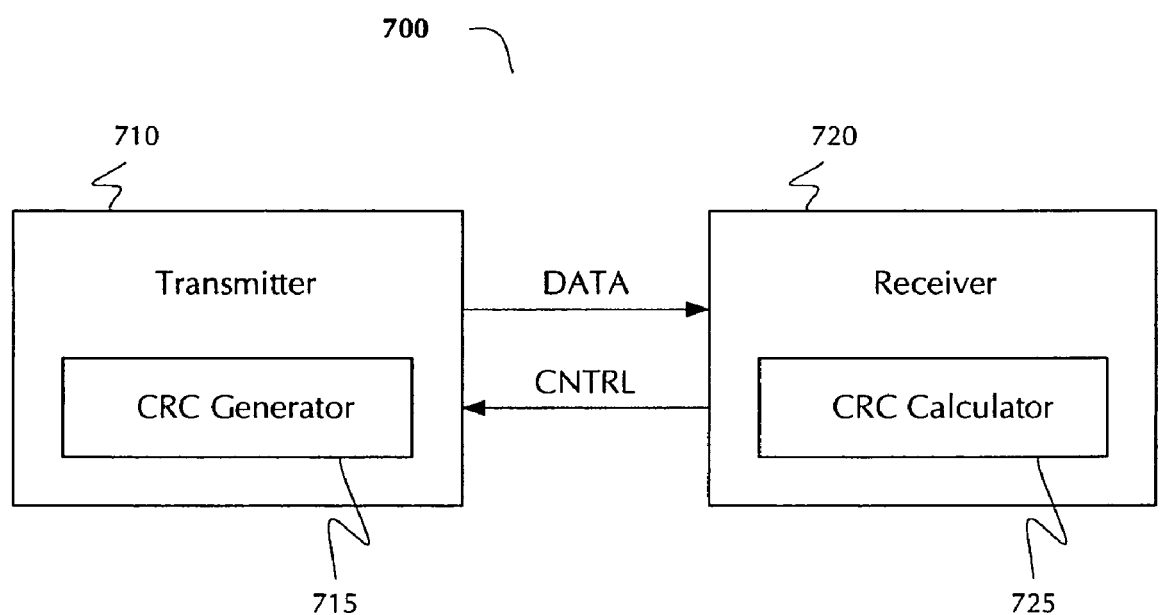
FIG. 8 is a box level diagram of an exemplary system configured to employ the present invention.

For example, and referring now to FIG. 8, a system 700 implementing the present invention may comprise a transmitter 710, a receiver 720, and at least two busses therebetween: (1) a serial information transmission bus DATA from transmitter 710 to receiver 720, and (2) a unidirectional control bus CNTRL from receiver 720 to transmitter 710. While the serial information bus DATA is generally single bit and unidirectional, control bus CNTRL may be single bit or multi-bit, and may be serial or parallel. As is known to those skilled in the art, transmitter 710 further includes a CRC generator 715, which generally comprises a conventional CRC calculating circuit (and which may comprise the error detection circuit described above) and a further circuit configured to append or insert a CRC generated on a unit of data by CRC generator 715 to the unit of data to be transmitted by transmitter 710 to receiver 720. Similarly, receiver 720 (which generally comprises the receiver circuitry and/or architecture described above) further includes a CRC calculator 725, which generally comprises the error detection circuit described above and further circuitry configured to remove the CRC generated by CRC generator 715 and compare it to the CRC calculated by the error detection circuit in CRC calculator 725. As described above, depending on whether the calculated CRC matches the generated CRC, a control signal (e.g., CNTRL) may be transmitted to transmitter 710 to either acknowledge receipt of an uncorrupted data unit (calculated CRC matches) or request retransmission of corrupted data (calculated CRC does not match). Thus, in preferred embodiments of the present system, the transmitter further comprises (i) a CRC generator configured to calculate CRC information, and/or (ii) a transmitter processor configured to add the CRC information to or insert the CRC information in the non-data information; the receiver may further comprise a control circuit configured to generate the control signal in response to the error detection circuit detecting (i) an error in the data portions and the zero-padded data portion of the information, and/or (ii) no error in the data portions and the zero-padded data portion of the information; and/or the system may further comprise a control bus configured to transmit the control signal from the receiver to the transmitter.

In further embodiments, the system may be configured to convert serial data from the network to parallel data for a device, and convert parallel data from the device to serial data for the network. Thus, the system may further include (1) a deserializer as described above, included in the receiver; (2) a serializer (included in the transmitter) configured to convert parallel information from a device including the transmitter to serial information for a network; (3) a decoder as described above, included in the receiver; (4) an encoder (included in the transmitter) configured to encode certain non-data information and append or insert such encoded information to the information to be transmitted onto a network; (5) a data processor in the receiver as described above; and/or (6) a receiver functional block as described above. In a preferred implementation, the receiver in the system further comprises a second transmitter (i.e., the receiver is a transceiver or part of a multiplexer, network switch, repeater, router or SERDES device).

A further aspect of the invention concerns a network, comprising (a) a plurality of the present systems, in communication with each other; and (b) a plurality of storage or communications devices, wherein each storage or communications device is in communication with at least one of the systems. The network may be any kind of known network, such as a storage network (e.g., RAID array), Ethernet, or wireless network, but preferably, the network comprises a storage network. The network may include any known storage or communications device, but preferably, at least a plurality of the coupled devices comprises storage devices.

CONCLUSION/SUMMARY

Thus, the present invention provides a method, circuit, architecture, and system for detecting or determining an error in a data transmission. The method generally comprises (1) partitioning the unit of digital data into one or more full data lines and a remainder, wherein each of the full data lines comprises a predetermined number of data blocks, each of the data blocks has a first fixed length, the predetermined number is an integer of at least 2, and the remainder has a length less than the predetermined number of data blocks times the first fixed length; (2) if the remainder is at least one bit long, adding to the remainder a padding vector having a length sufficient to generate a padded data line having the predetermined number of data blocks; and (3) performing error checking calculations on the full data lines and the zero-padded data line. The circuit and architecture generally comprise (a) a data partitioning circuit configured to partition a unit of the digital data into (i) one or more full data lines comprising a plurality of data blocks, each data block having a first fixed length, and (ii) a remainder, if the unit of digital data is not partitionable into an integer number of the data lines; (b) a padding circuit configured to add a padding vector to the remainder, if present, to generate a padded data line having a length equal to that of the plurality of data blocks; and (c) an error detection circuit configured to (i) receive the full data lines and the padded data line, and (ii) detect a transmission error in the unit of the digital data from the full data lines and the padded data line. The full data lines and the padded data line generally have a common, fixed bit length. This feature enables a single error detection circuit to calculate redundant code (such as a CRC, Hamming code or a checksum) on data of any length, thereby reducing the chip area dedicated to error detection, increasing the utilization efficiency of the circuitry on the chip, and reducing power consumption.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of checking a unit of digital data for a transmission error, comprising the steps of:
    a) partitioning said unit of digital data into (i) one or more full data lines and (ii) a remainder, wherein each of said full data lines comprises a predetermined number of data blocks, each of said data blocks has a first fixed length of $2^n$ bits, where n is an integer of at least 3, said predetermined number is an integer of at least 2, and said remainder has a second length less than said predetermined number times said first fixed length;
    b) when said second length is at least one bit, selecting a padding vector from a set of padding vectors stored in a storage table, and adding the padding vector to said remainder, said padding vector having a length sufficient to generate a padded data line having said predetermined number of data blocks; and
    c) performing error checking calculations on said full data lines and said padded data line.

2. The method of claim 1, wherein each of said padding vectors in said set of padding vectors is a zero-pad vector.

3. The method of claim 1, further comprising the step of determining whether said remainder has a length of at least one bit.

4. The method of claim 3, wherein said second length is equal to an integer number of said data blocks, said integer number being less than said predetermined number.

5. The method of claim 4, further comprising the step of determining the number of data blocks in said second length.

6. The method of claim 5, wherein said storage table comprises a hash table or a look-up table.

7. The method of claim 6, wherein said padding vector is selected based on information about the number of data blocks in said second length.

8. The method of claim 1, wherein said error checking calculations comprise cyclic redundancy check (CRC) calculations.

9. The method of claim 1, wherein said first fixed length comprises $2^m$ bits, where m is an integer from 6 to 10.

10. The method of claim 1, wherein said unit of digital data comprises a packet or frame.

11. The method of claim 1, wherein n is an integer from 3 to 6.

12. The method of claim 11, wherein n is 5.

13. The method of claim 1, wherein said performing step comprises (i) generating redundant error checking code from said full data lines and said padded data line and (ii) comparing the redundant error checking code with redundant error checking information transmitted with the unit of digital data.

14. The method of claim 1, wherein said checking step comprises checking each of said full data lines and said padded data line with common circuitry.

15. The method of claim 1, further comprising receiving said digital data.

16. A computer-readable medium storing a set of instructions which, when executed by a signal processing device configured to execute computer-readable instructions, is configured to perform the method of claim 1.

17. The computer-readable medium of claim 16, wherein said set of padding vectors are stored in a hash table or a look-up table.

18. The computer-readable medium of claim 17, wherein said padding vector is selected in response to information comprising said second length of said remainder.

19. The computer-readable medium of claim 16, wherein said padding vector is a zero-pad vector.

20. The computer-readable medium of claim 16, wherein said set of instructions further comprises an instruction to determine a length of said remainder.

21. The computer-readable medium of claim 16, wherein said second length is equal to an integer number of said data blocks, said integer number being less than said predetermined number, and said set of instructions further comprise an instruction to determine the number of data blocks in said second length.

22. The computer-readable medium of claim 16, wherein said error checking calculations comprise cyclic redundancy check (CRC) calculations.

23. The computer-readable medium of claim 16, wherein said set of instructions further comprises instructions to (i) calculate redundant error checking code from said full data lines and said padded data line and (ii) compare the redundant error checking code with redundant error checking information transmitted with the unit of digital data.

24. A method of checking a packet or frame for a transmission error, comprising:
    a) partitioning said packet or frame into (i) one or more full data lines and (ii) a remainder, wherein said packet or frame comprises $(2^x \cdot y)+z$ words, $2^x$ is the number of words in one of said full data lines, x is an integer of from 1 to 4, y is the number of full data lines in said packet or frame, and z is an integer of less than $2^x$, and said remainder has a length less than a fixed length of said full data line;

b) if said length of said remainder is at least one bit, selecting a padding vector from a set of padding vectors stored in a storage table, and adding said padding vector to said remainder, said padding vector having a length sufficient to generate a padded data line having said fixed length; and c) performing error checking calculations on said full data lines and said padded data line.

25. The method of claim 24, wherein when z is at least 1, said length of said padding vector is $2^x-z$ words.

26. The method of claim 24, further comprising selecting said padding vector from a set of padding vectors of varying lengths stored in a storage circuit.

27. A circuit for determining a digital data transmission error, comprising:

a) a data partitioning circuit configured to partition a unit of said digital data into (i) one or more full data lines comprising a plurality of data blocks, each data block having a first fixed length of $2^n$ bits, where n is an integer of at least 3, and (ii) a remainder, if said unit of digital data is not partitionable into an integer number of said data lines;

b) a storage circuit configured to store a set of padding vectors of varying lengths;

c) a padding circuit configured to add one of said padding vectors to said remainder, if present, to generate a padded data line having a length equal to that of said plurality of data blocks; and d) an error detection circuit configured to (i) receive said full data lines and said padded data line, and (ii) detect a transmission error in said unit of said digital data from said full data lines and said padded data line.

28. The circuit of claim 27, wherein said storage circuit comprises a hash table or a look-up table; and said padding circuit further comprises a padding vector selector, configured to select one of said padding vectors.

29. The circuit of claim 27, wherein said storage circuit comprises a hash table or a look-up table.

30. The circuit of claim 29, wherein each of said padding vectors in said set of padding vectors is a zero-pad vector.

31. The circuit of claim 27, wherein said padding circuit selects said one of said padding vectors in response to a remainder information signal, and a state of said remainder information signal corresponds to a length of said remainder.

32. The circuit of claim 31, further comprising a logic circuit configured to generate said remainder information signal.

33. The circuit of claim 27, wherein n is from 3 to 7.

34. The circuit of claim 27, wherein each of said full data lines and said padded data line comprise $2^x$ data blocks, where x is an integer from 1 to 4.

35. The circuit of claim 27, wherein said unit of digital data comprises a packet or frame.

36. The circuit of claim 27, wherein each of said data blocks consists of a data word.

37. The circuit of claim 27, wherein said data partitioning circuit comprises a deserializer and/or a plurality of data bit storage elements configured to store one or more of said plurality of data blocks.

38. The circuit of claim 27, wherein said error detection circuit comprises a cyclic redundancy checking (CRC) circuit.

39. A receiver, comprising:
a) the circuit of claim 27;
b) a processor in communication with said circuit, configured to process said digital data; and c) a clock recovery circuit configured to recover a clock signal from serial data received by said receiver.

40. The receiver of claim 39, embodied on a single integrated circuit.

41. The receiver of claim 39, further comprising a divider configured to divide said recovered clock.

42. The receiver of claim 39, wherein said processor is configured to process said full data lines and said padded data line received from said error detection circuit.

43. The receiver of claim 39, wherein said data partitioning circuit comprises a deserializer configured to convert serial digital data into parallel digital data for processing by said error detection circuit.

44. The receiver of claim 39, wherein said unit of digital data comprises a packet or frame.

45. The receiver of claim 44, wherein each of said data blocks consists of a data word.

46. The receiver of claim 44, wherein said processor is further configured to assemble (i) non-data information from said packet or frame and (ii) at least part of said digital data.

47. The receiver of claim 46, further comprising a decoder configured to decode at least part of said non-data information.

48. The receiver of claim 39, further comprising a logic circuit configured to (i) receive said padded data line from said error detection circuit and (ii) remove said padding vector from said padded data line.

49. The receiver of claim 39, wherein said error detection circuit comprises a cyclic redundancy checking (CRC) circuit.

50. A system for transferring data on or across a network, comprising:
a) the receiver of claim 39;
b) at least one transmitter in communication with said receiver, said transmitter being configured to transmit said serial information to said receiver; and
c) at least one receiver port in communication with said receiver for receiving said serial information.

51. The system of claim 50, wherein said error detection circuit comprises a cyclic redundancy checking (CRC) circuit.

52. The system of claim 51, wherein said transmitter further comprises (i) a CRC generator configured to generate CRC information from a data portion of said serial information and (ii) a transmitter processor configured to add said CRC information to or insert said CRC information in said serial information.

53. The system of claim 50, wherein said receiver further comprises a control circuit configured to generate a control signal in response to said error detection circuit detecting at least one of an error and no error in said unit of digital data.

54. The system of claim 50, further comprising a control bus configured to transmit said control signal from said receiver to said transmitter.

55. A network, comprising:
a) a plurality of the systems of claim 50, in communication with each other; and
b) a plurality of storage or communications devices, each of said storage or communications devices being in communication with one of said systems.

56. The network of claim 55, wherein said plurality of storage or communications devices comprises a plurality of storage devices.

57. A circuit for determining a digital data transmission error, comprising:
a) a data partitioning circuit configured to partition a unit of said digital data into (i) one or more full data lines comprising a plurality of data blocks, each data block having a first fixed length, and (ii) a remainder, if said unit of digital data is not partitionable into an integer number of said data lines;
b) a padding circuit configured to add a padding vector to said remainder, if present, to generate a padded data line having a length equal to that of said plurality of data blocks, wherein each of said full data lines and said padded data line has a second fixed length, and said second fixed length is an integer multiple of said first fixed length; and
c) an error detection circuit configured to (i) receive said full data lines and said padded data line, and (ii) detect a transmission error in said unit of said digital data from said full data lines and said padded data line.

58. The circuit of claim 57, wherein said second fixed length consists of $2^m$ bits, where m is an integer from 6 to 10.

59. A receiver, comprising:
a) a circuit for determining a digital data transmission error, comprising
  i) a data partitioning circuit configured to partition a unit of said digital data into one or more full data lines comprising a plurality of data blocks, each data block having a first fixed length, and a remainder, if said unit of digital data is not partitionable into an integer number of said data lines,
  ii) a padding circuit configured to add a padding vector to said remainder, if present, to generate a padded data line having a length equal to that of said plurality of data blocks, wherein each of said full data lines and said padded data line has a second fixed length, and said second fixed length is an integer multiple of said first fixed length; and
  iii) an error detection circuit configured to (i) receive said full data lines and said padded data line, and (ii) detect a transmission error in said unit of said digital data from said full data lines and said padded data line;
b) a processor in communication with said circuit, configured to process said digital data; and
c) a clock recovery circuit configured to recover a clock signal from serial data received by said receiver.

60. The receiver of claim 59, wherein said second fixed length consists of $2^m$ bits, where m is an integer from 6 to 10.

61. A circuit for determining a data transmission error, comprising:
a) means for partitioning a unit of said data into (i) one or more full data lines, each comprising a plurality of data blocks, each data block having a first fixed length, and (ii) a remainder, if said unit of digital data is not partitionable into an integer number of said data lines;
b) means for padding said remainder, if said remainder has a non-zero length, to generate a padded data line having a length equal to that of said plurality of data blocks, wherein each of said full data lines and said padded data line has a second fixed length, and said second fixed length is an integer multiple of said first fixed length; and
c) means for detecting a transmission error in said unit of data from said full data lines and said padded data line.

62. A circuit for determining a data transmission error, comprising:
a) means for partitioning a unit of said data into (i) one or more full data lines, each comprising a plurality of data blocks, each data block having a first fixed length of $2^n$ bits, where n is an integer of at least 3, and (ii) a remainder, if said unit of digital data is not partitionable into an integer number of said data lines;
b) means for storing a set of padding vectors of varying lengths;
c) means for selecting one of said padding vectors and padding said remainder, if said remainder has a non-zero length, to generate a padded data line having a length equal to that of said plurality of data blocks; and
d) means for detecting a transmission error in said unit of data from said full data lines and said padded data line.

63. The circuit of claim 62, wherein each of said padding vectors in said set of padding vectors is a zero-pad vector.

64. The circuit of claim 62, wherein said means for selecting selects said one of said padding vectors in response to a remainder information signal, and a state of said remainder information signal corresponds to a length of said remainder.

65. The circuit of claim 64, further comprising a means for generating said remainder information signal.

66. The circuit of claim 62, wherein n is from 3 to 7.

67. The circuit of claim 62, wherein each of said full data lines and said padded data line comprise $2^x$ data blocks, where x is an integer from 1 to 4.

68. The circuit of claim 62, wherein said unit of digital data comprises a packet or frame.

69. The circuit of claim 62, wherein each of said data blocks consists of a data word.

70. The circuit of claim 62, wherein said means for partitioning comprises a means for deserializing said data.

71. The circuit of claim 62, wherein said means for detecting comprises a means for calculating cyclic redundancy code.

72. A receiver, comprising:
a) the circuit of claim 62;
b) a means for processing in communication with said circuit, configured to process said data; and
c) a means for recovering a clock signal from serial data received by said receiver.

73. The receiver of claim 72, embodied on a single integrated circuit.

74. The receiver of claim 72, further comprising a means for dividing said recovered clock.

75. The receiver of claim 72, wherein said means for processing processes data received from said means for detecting.

76. The receiver of claim 72, wherein said unit of data comprises a packet or frame.

77. The receiver of claim 76, wherein each of said data blocks consists of a data word.

78. The receiver of claim 76, wherein said means for processing comprises a means for assembling (i) non-data information from said packet or frame and (ii) said unit of data.

79. The receiver of claim 78, further comprising a means for decoding at least part of said non-data information.

80. The receiver of claim 78, wherein said means for processing further comprises a means for removing said padding vector from said padded data line.

81. The receiver of claim 72, wherein each of said full data lines and said padded data line has a second fixed length, and said second fixed length is an integer multiple of said first fixed length.

82. The receiver of claim 81, wherein said second fixed length consists of $2^m$ bits, where m is an integer from 6 to 10.

83. The receiver of claim 72, wherein said means for detecting comprises a means for calculating cyclic redundancy code.

84. A system for transferring data on or across a network, comprising:
- a) the receiver of claim 72;
- b) a means for transmitting said serial data to said receiver; and
- c) at least one means for receiving said serial data, said means for receiving being in communication with said receiver.

85. The system of claim 84, wherein said means for detecting comprises a first means for calculating cyclic redundancy code.

86. The system of claim 84, wherein said means for transmitting further comprises (i) a second means for calculating cyclic redundancy code and (ii) a means for adding cyclic redundancy code information to or insert cyclic redundancy code information in said serial data.

87. The system of claim 86, wherein said receiver further comprises a means for generating a control signal in response to at least one of (i) an error in said unit of data and (ii) no error in said unit of data detected by said means for detecting.

88. A network, comprising:
- a) a plurality of the systems of claim 84, in communication with each other; and
- b) a plurality of means for storing or means for communicating data, each of said means for storing or means for communicating data being in communication with at least one of said systems.

89. The network of claim 88, wherein said plurality of means for storing or means for communicating data comprises a plurality of means for storing.

* * * * *